(12) United States Patent
Braun et al.

(10) Patent No.: US 10,871,535 B2
(45) Date of Patent: Dec. 22, 2020

(54) MAGNETIC RESONANCE FINGERPRINTING OPTIMIZATION IN MAGNETIC RESONANCE IMAGING

(71) Applicant: Siemens Healthcare GmbH, Erlangen (DE)

(72) Inventors: Christian Alexander Braun, Schwaebisch Hall (DE); Mariappan S. Nadar, Plainsboro, NJ (US); Xiao Chen, Princeton, NJ (US); Boris Mailhe, Plainsboro, NJ (US)

(73) Assignee: Siemens Healthcare GmbH, Erlangen (DE)

(*) Notice: Subject to any disclaimer, the term of this patent is extended or adjusted under 35 U.S.C. 154(b) by 173 days.

(21) Appl. No.: 16/143,865

(22) Filed: Sep. 27, 2018

(65) Prior Publication Data

US 2019/0094322 A1 Mar. 28, 2019

Related U.S. Application Data

(60) Provisional application No. 62/564,585, filed on Sep. 28, 2017.

(51) Int. Cl.
*G01R 33/56* (2006.01)
*G06K 9/00* (2006.01)
(Continued)

(52) U.S. Cl.
CPC .......... *G01R 33/56* (2013.01); *G01R 33/50* (2013.01); *G06K 9/00013* (2013.01);
(Continued)

(58) Field of Classification Search
CPC .......... G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614
See application file for complete search history.

(56) References Cited

U.S. PATENT DOCUMENTS

2017/0234951 A1* 8/2017 Zhao .................. G01R 33/50
324/309

OTHER PUBLICATIONS

Cline, Christopher C., et al. "AIR-MRF: Accelerated iterative reconstruction for magnetic resonance fingerprinting." Magnetic resonance imaging 41 (2017): 29-40.
(Continued)

*Primary Examiner* — Tung X Nguyen

(57) ABSTRACT

For determining a configuration for a MR scanner using MRF, MRF is optimized using a model of acquisition and reconstruction together. The effects of under sampling and reconstruction are included in the model being optimized with the sequence. A spatial distribution of response is used in the MRF optimization. An added transformation may be included to convert the fingerprint into a domain for noise removal and/or more direct parameter estimation without the dictionary. Artificial intelligence may be used to alter and/or select the type of optimization or optimization settings and/or to optimize.

20 Claims, 5 Drawing Sheets

(51) Int. Cl.
*G06N 3/08* (2006.01)
*G06N 3/04* (2006.01)
*G06N 3/00* (2006.01)
*G01R 33/50* (2006.01)
*G01R 33/48* (2006.01)
*G06N 3/12* (2006.01)

(52) U.S. Cl.
CPC ......... *G06K 9/00087* (2013.01); *G06N 3/006* (2013.01); *G06N 3/0445* (2013.01); *G06N 3/08* (2013.01); *G01R 33/4818* (2013.01); *G06N 3/126* (2013.01)

(56) References Cited

OTHER PUBLICATIONS

McGivney, Debra F., et al. "SVD compression for magnetic resonance fingerprinting in the time domain." IEEE transactions on medical imaging 33.12 (2014): 2311-2322.

Zhao, Bo, et al. "Improved magnetic resonance fingerprinting reconstruction with low-rank and subspace modeling." Magnetic resonance in medicine 79.2 (2018): 933-942.

Zhao, Bo, et al. "Optimal experiment design for magnetic resonance fingerprinting: Cramer-Rao bound meets spin dynamics." arXiv preprint arXiv:1710.08062 (2017).

* cited by examiner

MAGNETIC RESONANCE FINGERPRINTING OPTIMIZATION IN MAGNETIC RESONANCE IMAGING

RELATED APPLICATION

The present patent document claims the benefit of the filing date under 35 U.S.C. § 119(e) of Provisional U.S. Patent Application Ser. No. 62/564,585, filed Sep. 28, 2017, which is hereby incorporated by reference.

BACKGROUND

The present embodiments relate to magnetic resonance (MR) imaging. Magnetic resonance fingerprinting (MRF) is a technique for multiparametric quantitative imaging. Multiple parameters (e.g., T1, T2, PD, etc.) are measured by applying a pseudo-random excitation with an under-sampled acquisition. For each pixel, the measured response over time (i.e., fingerprint) is matched to a dictionary of possible responses. The matched dictionary entry provides the values of the multiple parameters. MRF provides multiple parameter values in less time than needed to separately scan for each parameter.

For MR imaging, both acquisition and reconstruction feature multiple interconnected degrees of freedom including but not limited to settings for the excitation parameters (flip angles, repetition times, sequence length, etc.), sampling patterns, compression rates, and reconstruction algorithms. These degrees of freedom are used together to provide the best measurement possible while taking all constraints into account. For MRF, optimization may be applied to the sequence to find the sequence that provides a fingerprint for a given tissue. For example, excitation sequences are optimized considering properties of the dictionary. Other acquisition and reconstruction settings are chosen based on the application. Even with the optimized sequence, the MRF-based parameter values may be less accurate than desired.

SUMMARY

Systems, methods, and instructions on computer readable media are provided for determining a configuration for a MR scanner using MRF. MRF is optimized using a model of acquisition and reconstruction together. The effects of undersampling and reconstruction are included in the model being optimized with the sequence. A spatial distribution of response is used in the MRF optimization. An added transformation may be included to convert the fingerprint into a domain for noise removal and/or more direct parameter estimation without the dictionary. Artificial intelligence may be used to alter and/or select the type of optimization or optimization settings and/or to optimize.

In a first aspect, a method is provided for determining a configuration for a MR scanner using MRF. A first image fingerprint is generated from MR corresponding to a first sequence and a plurality of ground truth values of magnetic resonance output parameters. The first image fingerprint is transformed to k-space. A first sampling pattern is applied to the transformed first image fingerprint. First values of the MR output parameters are reconstructed from results of the applying of the first sampling pattern. The reconstruction uses a first reconstruction setting. The first values with respect to the ground truth values are scored. The scoring is optimized based on repetition of the generating with different sequences than the first sequence, transforming, applying with different sampling patterns than the first sampling pattern, and reconstructing with different reconstructing settings. A MRF sequence is selected from the first and different sequences; a MRF sampling pattern is selected from the first and different sampling patterns; and a MRF reconstruction setting is selected from the first and different reconstruction settings. The selected MRF sequence, sampling pattern, and reconstruction setting are provided for the magnetic resonance scanner.

In a second aspect, a method is provided for determining a configuration for a MR scanner using MRF. The MRF is optimized with a model including (a) a scan sequence and a reconstruction from fingerprint matching to a dictionary. A score for the optimizing is based on a reconstruction map of a plurality of locations. A configuration as optimized is provided to the magnetic resonance scanner.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EMBODIMENTS

An end-to-end optimization framework for MRF accounts for sampling and reconstruction even in optimizing for sequence alone. The sampling and/or reconstruction may also be optimized due to inclusion of the sampling and reconstruction in the framework. In contrast to previous work optimizing the sequence alone, a full end-to-end optimization improves the considered degrees of freedom based on actual reconstruction results of multiple ground truths. Only optimizing the dictionary fingerprints due to the sequence does not deal with sampling or reconstruction. Since the effects that occur during acquisition and reconstruction are explicitly included, the resulting sequences are robust against the used undersampling pattern, such as leading to better quality of reconstructed parameter maps. A clinically applicable MRF scan results from providing a tool to increase measurement accuracy and reduce acquisition time while generally enabling shaping the process to the needs of a given application. Better reconstruction quality, lower RF energy deposition, and/or shorter scan time may be provided.

In another aspect, transformed domain MRF reconstruction is provided. By transforming the fingerprint, the values of the parameters may be determined in the transformed domain. Reconstruction accuracy is increased, and reconstruction time is reduced.

In yet another aspect, machine learning is used to optimize for the end-to-end optimization framework for MRF. A machine-learned network selects the type of optimization and/or settings for the optimization. The selection may be dynamic, such as changing throughout the optimization. A machine-learned network may output the changes to the sequence, sampling, and/or reconstruction. A large number of degrees of freedom may be optimized at once efficiently using a machine-learned network. Machine-learning for tuning the optimization may be used in a variety of optimization problems independent of the specific application.

Figure 1:
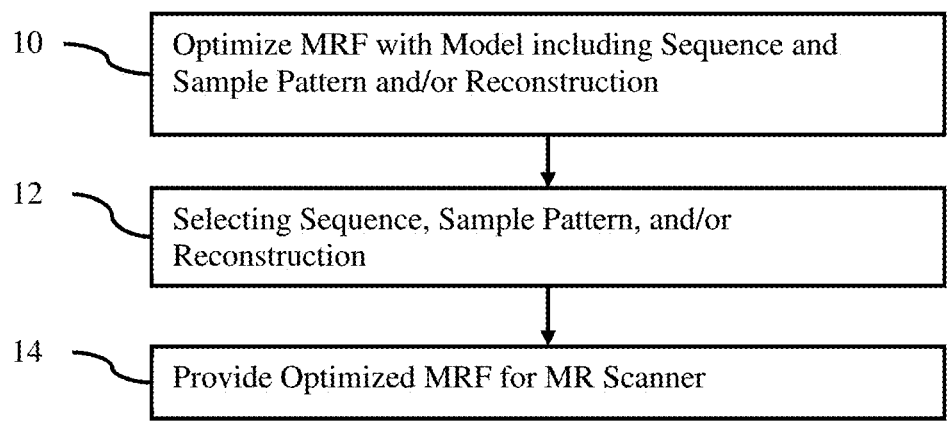
FIG. 1 is a flow chart of one embodiment of a method for determining a configuration for a MR scanner using MRF.

FIG. 1 shows a flow chart of one embodiment of a method for determining a configuration for a MR scanner using MRF. A model with the sequence and sample pattern, sequence and reconstruction, or sequence, sample pattern, and reconstruction is used in optimization. This end-to-end model of the MRF process accounts for undersampling and/or reconstruction even for optimizing the sequence alone. The sampling pattern and/or reconstruction may also or instead be optimized.

The method is implemented by an image processor, such as part of a server, computer, or workstation. A MR scanner and phantom may be used. The MR scanner may be modeled, such as for simulating measurements by the MR scanner.

The method is performed in the order shown or other orders. For example, the selection of act 12 occurs as part of the optimization of act 10. Additional, different, or fewer acts may be provided. For example, act 14 is not provided.

In act 10, the image processor optimizes the MRF with a model including a scan sequence and a reconstruction from fingerprint matching to a dictionary. The MRF pulse sequence is optimized directly from the final reconstruction quality of the quantitative maps. A score for the optimization is based on the reconstruction maps for various parameters. The score is based on the values of the parameters for a plurality of locations, allowing optimization based on spatial variation.

Any optimization may be used. In one embodiment, a particle swarm optimization is used. Evolutionary or other non-gradient based optimizations may be used. An output of a machine-learned network may be used in the optimization, such as to select a type of optimization, settings of the optimization, and/or to perform the optimization.

The optimization outputs values for or changes to settings for the scan sequence, sampling pattern, and/or reconstruction. Since the model includes the sequence, sampling, and reconstruction, settings for any of sequence, sampling, and reconstruction may be optimized. The optimization may be sequential. The optimal value for one sequence, sampling, or reconstruction setting is determined before determining the optimal value of another setting. The optimization may be parallel, finding an optimal combination of values for multiple settings. Any number of settings may be optimized. Other settings may be manually determined or use default values.

Since the model includes the whole image pipeline (e.g., scan sequence, spatial encoding, and reconstruction algorithms) in the optimization, MR system imperfection (e.g., off-resonance) may be introduced. The optimization accounts for the characteristics of the specific MR scanner by modeling the operation of the MR scanner, such as in Bloch simulation, sampling constraints, and/or reconstruction operation.

In act 12, the image processor selects one or more values for settings. The optimization tests different values for one or more settings. The value or values resulting in better scores in the optimization are selected. These optimized value or values of one or more settings are to be used to configure an MR scanner for MRF.

Values for one or more settings may not be optimized. For example, default or application based-values are used. Optimized values are used for one or more other settings (i.e., a sub-set of the settings). Alternatively, the optimization is used to determine values for all the settings.

The selected values are for operation of the MR scanner. The MR scanner may be configured by the values. The values control operation of the MR scanner. By selecting optimized values, the MR scanner may more optimally perform MRF.

In act 14, the image processor provides a configuration. The settings, as optimized, are provided for the MR scanner. The configuration is for the scan sequence, sampling pattern, and/or reconstruction to be performed by the MR scanner.

Different configurations may be provided for different applications. The application may set constraints, penalties, and/or different sample patterns of output MR parameters (e.g., T1, T2, PD, etc.) used in the optimization. Different configurations may be provided for different MR scanners. Due to capability and/or performance, the optimization may be specific to the type of MR scanner or even a particular MR scanner. The model includes the limitations, performance characteristics, and/or capabilities of the type of MR scanner or particular MR scanner.

The configuration is provided for the MR scanner. The configuration is stored in a memory, such as a database with other configurations. The configuration may be later used by a MR scanner for MRF imaging of a patient.

The configuration may be provided to the MR scanner. The configuration is loaded, such as by transfer over a computer network or from a memory, on the MR scanner. Once the user configures the MR scanner for a given MRF application, the corresponding configuration is obtained. A controller or controllers of the MR scanner sets the various components to operate according to the values of the configuration. The MR scanner scans a patient and reconstructions parameter maps for multiple parameters using MRF based on the configuration.

Figure 2:
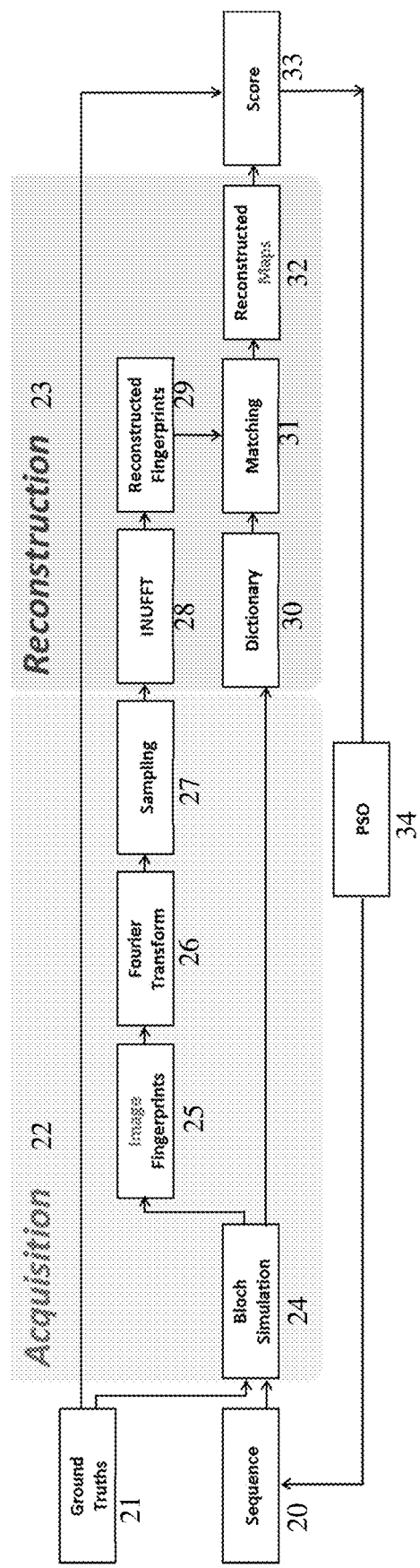
FIG. 2 illustrates a model and flow chart of one embodiment of determining a configuration for a MR scanner using MRF.

FIG. 2 shows a model and corresponding flow chart for another embodiment of a method for determining a configuration for a MR scanner using MRF. The model includes the acquisition 22 and reconstruction 23 of the MR scanner. The acquisition 22 includes the fingerprinting 25 from the sequence 20 and the sampling 27. The reconstruction 23 includes the reconstructed fingerprint 29 and matching 31 used to generate the reconstructed maps 32 of the output MR parameters. Additional, different, or fewer components of the model and/or corresponding acts may be provided.

The ground truths 21 include one or more samples of a plurality of MR parameter maps. Any combination of MR parameters may be used in MRF, such as T1, T2, and PD. A plurality of ground truth values corresponding to the plurality of output MR parameters is provided. The ground truths 21 may be from scans of patients. The scans may be of the same patient but using different sequences, sampling, and/or reconstruction to separately generate each of the MR parameter maps. The ground truths 21 are for a given application (e.g., organ and/or pathology) and/or MR scanner or type of scanner.

For the application, any number of samples of MR parameter maps are used. By providing multiple samples from different patients for the application, multiple ground truths 21 are provided for each MR parameter map. The optimization may use scoring based on modeling MRF for multiple samples. Alternatively, only one sample MR parameter map is provided for each MR parameter.

The sequence 20 is an initial sequence. The sequence 20 includes settings for flip angle, repetition time, sequence length, and other settings defining the MR pulses to scan a patient. The initial sequence 20 may be a pseudo-randomly designed sequence or any other MRF sequence. A previously optimized sequence, such as for another application, may be used.

The image processor uses Bloch simulation 24 to generate the image fingerprint 25. The Bloch simulation 24 uses a model of the MR scanner physics to simulate scanning by the sequence. The MR scanner physics may be calibrated to or model a specific one or type of MR scanner. Other simulations may be used. The simulation uses the ground truth MR parameter maps and the sequence to generate the image fingerprint 25. The simulation emulates the MR scanner scanning to provide the ground truth 21. The image fingerprint 25 resulting in the ground truth 21 given the sequence 20 is determined from the simulation.

The image fingerprint 25 is in the image or object domain. A response over time for a given location is generated as the image fingerprint 25. Since the model includes sampling 27 and reconstruction 23, image fingerprints 25 are generated for a plurality of spatial locations. The sampling 27 and reconstruction 23 use two or three-dimensional distribution. Alternatively, one image fingerprint 25 is generated for one location.

As an alternative to using simulation, a phantom may be used. The sequence 20 is used to scan a phantom. The fingerprint 25 is determined from the scan of the phantom using the sequence 20. The known values of the output MR parameters for that phantom are used as the ground truth 21. For example, the ground truth 21 is formed by image generation (i.e., k-space data transformation and reconstruction) from other MR parameter specific scans of the phantom.

The image processor 26 transforms the image fingerprint 25 or fingerprints 25 to k-space. Any transformation may be used, such as Fourier transformation. A fast Fourier transformation may be used. The transformation changes the image or object domain fingerprint to k-space data. K-space data representing measurements from the MR scanner are created by transformation.

The acquisition 22 models MR measurement by the MR scanner or type of MR scanner. The acquisition 22 of the model generates under sampled k-space data. Undersampled k-space data is generated based on the Bloch simulations using ground truths 21 of certain distributions of the tissues, the sequence 20 of excitations, and the k-space sampling patterns 27.

The image processor applies a sampling pattern 27 to the transformed image fingerprints 25. Alternatively, the fingerprints 25 are generated by simulation 24 based on the sampling pattern 27.

The sampling pattern 27 is defined by one or more settable parameters. For example, the sampling pattern 27 has a trajectory (e.g., Cartesian, radial, or spiral), an amount of undersampling (e.g., using 24 spirals where 48 spirals sample the full k-space), uniformity of sampling (e.g., which of the sub-sampled spirals to include), and/or different sampling orders (e.g., the sequence of spirals used). Other settings for sampling may be used. The undersampled k-space data is generated based on the Bloch simulations 24 using ground truths 21 of certain distributions of the tissues, the sequence 20 of excitations, and the k-space sampling patterns 27.

The image processor applies the model of reconstruction 23 to the k-space data generated by the model of acquisition 22. The reconstruction 23 reconstructs the output MR parameters from the k-space data of the fingerprints 25 resulting from applying the sampling 27. The values of output MR parameters are reconstructed from the k-space data. The output MR parameters include two or more parameters to be estimated from the same scan, such as T1, T2, PD, off-resonance, partial volume ratio and etc.

The image processor performs an inverse Fourier transform of the k-space data output by the model of acquisition 22. The inverse transform transforms the k-space data to the image or object domain, resulting in a reconstructed fingerprint 29. The response over time in the image domain after the transform 26, sampling 27, and inverse transformation 28 is provided for matching 31.

Reconstructed fingerprints 29 are provided for each location. Since a spatial distribution is provided, the reconstruction 23 is for a two or three-dimensional region. The values for the output MR parameters are reconstructed for a plurality of spatial locations.

The reconstruction 23 may use compression. For example, principle component analysis (PCA) is applied to each of the reconstructed fingerprint 29. The time series of the fingerprint 29 is compressed to a lesser amount of information or series entries. For example, a time series of images where each image is formed by the reconstructed fingerprints 29 at the respective time is reduced by PCA to a fewer number of images. The reduced number of images provide fingerprints for different locations over a fewer number of increments. The dictionary 30 stores the entries in memory as compressed by PCA, clustering, or other compression. Other non-linear compression may be used.

The dictionary 30 stores sample fingerprints and corresponding values for output MR parameters for each sample. Any number of samples may be stored. The samples may be uniformly distributed or may more densely sample the fingerprint space for some more likely occurrences than for less likely occurrences.

The reconstruction 23 uses dictionary matching 31 where a most similar sample from the dictionary 30 is found for the reconstructed fingerprint 29. Any measure of similarity may be used, such as correlation coefficient, minimum sum of absolute differences, or cross-correlation. Interpolation, extrapolation, or weighted combination may be used where multiple most similar samples from the dictionary 30 are identified.

Any MRF reconstruction 23 may be used. For example, a direct match 31 of the reconstructed fingerprint 29 to the dictionary 30 is used (i.e., non-iterative reconstruction such as AIRMRF). The time sequence of response in the image or object domain is used to select an entry of the dictionary 30 where the entry provides the values of the output MR parameters for the fingerprint. As another example, an iterative reconstruction 23 is used (e.g., AIR-MRF). Transformation and inverse transformation are repeated with different matching 31 to better fit the k-space data from the acquisition 22 to the image space.

The reconstruction 23 includes one or more settings. Example settings for MRF reconstruction include the type of reconstruction, the dictionary, type of compression, compression variables, type of similarity in matching 31, or other variables in the MRF reconstruction 23.

The matching 31 provides values for multiple output MR parameters. The matched sample from the library 30 provides the values. Where values are provided for different locations, a reconstructed map 32 of the output MR parameter values is provided. For example, a T1 map, T2 map, and PD map are reconstructed.

In an alternative embodiment for reconstruction 23, the reconstructed fingerprint 29 is transformed into another domain for determination of the values of the output MR parameters. After the inverse transformation 28 to reconstruct the fingerprint 29, a transform operator is applied to the reconstructed fingerprint 29. The concept of compressing the reconstructed fingerprint 29 is generalized to domain transformation. Any transform may be used, such as a wavelet, Fourier, PCA, or machine-learned network for transformation. The operator P may be a degree of freedom or setting to be optimized to achieve improved performance during the MRF reconstruction. This optimization may be included into the end-to-end optimization framework for MRF to design both sequence, operator, and, optionally, additional components of the acquisition and reconstruction pipeline to work together optimally.

A variety of possible goals may be pursued including, for example, improvement of the quality of the reconstructed parameter maps or dictionary free MRF reconstruction. The transformation may better separate information content in the reconstructed fingerprint 29. For example, noise may be better separated. The noise may be removed, such as by filtering or processing. The noise or other undesired content is removed in the transform operator domain. A sequence may be designed such that low pass fingerprints result and designed alongside optimizing the transform operator to provide low pass filtering removing high frequency noise and undersampling artifacts.

The matching 31 may be performed in the transform operator domain. A compression or other transform operator is applied to both dictionary and reconstructed fingerprints to transform them such that the matching is performed on a low rank representation of the dictionary 30. improving the quality and efficiency of the matching.

Alternatively, the transform allows for function-based determination of the values of the output MR parameters. Rather than dictionary matching 31, one or more characteristics of the reconstructed fingerprint 29 in the transform operator domain indicate the values. The reconstructed maps 32 are generated from the determined values.

The image processor scores the quality of one or more of the maps and/or output MR values. The scoring compares the value or values for each parameter with the ground truth 21. For example, the reconstructed map 32 for one output MR parameter (e.g., T1) is compared with the ground truth 21 map for that parameter. Any error metric may be used, such as L1, L2 (mean square error), root mean square, average error per pixel, or structural similarity.

After reconstruction, the quality of the reconstructed parameter maps is assessed and used as a score. A separate score is determined for each output MR parameter, such as a T1 score, T2 score, and PD score. For a given parameter, the score is based on information from multiple locations. The scores of different parameters may be maintained separately for optimization. Alternatively, a weighted summation or other combination is used to determine one score for the reconstruction 23.

As an alternative to or in addition to scoring based on difference in values, a variance by location may be used. Rather than referring to the ground truth 21, a spatial characteristic of the reconstructed map 32 is used. One or more features of the reconstructed map, such as smoothness, are used to score. The spatial variance information may be used in combination with the comparison to ground truth, such as weighted summation of scores.

The scoring may include penalty terms. The penalties may be for specific variables, such as sequence, sampling pattern, or reconstruction settings. For example, one or more sequence properties are undesired but not prevented. If the sequence used for a current iteration of the optimization violates the property, the penalty is added. The score is increased for minimization or decreased for maximization. Any mapping or function relating a property to the penalty in the score may be used. The amount of deviation from the desired range may be used to determine the level of penalty.

The image processor uses the score 33 for the optimization 34. The optimization 34 minimizes or maximizes the score. The optimization 34 determines a new value for a setting based on the score history, such as based on the amount of score change given a previous alteration. Repetition of the generation of k-space data with different sequences 20 than the initial sequence 20, transforming 26, applying with different sampling patterns 27 than the initial sampling pattern 27, and/or reconstructing with different reconstruction settings is performed. The resulting scores are used to determine a next change to a value of a setting or values of settings.

The changes to any setting occur in sequence. The optimization may optimize for the sequence settings, sampling settings, and reconstruction setting sequentially. Groups of settings may be altered at a same time or iteration. In other embodiments, all settings to be altered are altered or considered for alteration at each iteration. Since different values for the settings are possible, the optimization may optimize for the under-sampling pattern 27. The sequence 20, under sampling pattern 27, and/or both sequence 20 and under sampling pattern 27 may be optimized sequentially or at the same time as part of optimizing the acquisition 22 for MRF. By including the sampling 27 in the acquisition model 22, the sequence 20 may be optimized to be robust to various undersampling patterns 27, different compression rates, physical imperfections of the models, k-space noise, and/or slice profile effects.

In one embodiment, only the sequence 20 is optimized. The model including the sampling pattern 27 and reconstruction 23 provides for better optimization than merely using the image fingerprints 25 from modeling with the sequence. Only the sampling pattern 27, only the reconstruction 23, or any combination of two or more of sampling pattern 27, reconstruction 23, and sequence 20 may be optimized.

Specific sequence 20, sampling pattern 27, and/or reconstruction 23 settings are designed for specific use cases (e.g. sequence 20 for brain measurements) and/or specific reconstruction algorithms. The optimization may weight various considerations more heavily than other considerations. For example, the total number pulses for a periodic sequence is to be increased or decreased. Alternatively, the scoring relatively weights the considerations as penalties.

The changes in values for any repetition may be limited by one or more constraints. The range or available values for any given setting may be constrained. For example, the MR scanner may not be capable of settings beyond a limit. Properties like smoothness, small flip angles, or small repetition times may be included as constraints. The optimization is constrained to keep the values of the settings within the limits.

Any optimization 34 may be used. For example, particle swarm optimization is used. As another example, an evolutionary optimization may be used. The optimization algorithm (e.g. a particle swarm optimization algorithm) allows for a wide variety of goals like increasing the reconstruction quality or decreasing the acquisition time by, for example, designing sequences of different lengths.

The optimization 34 may output values for settings of the sequence 20. All the values for the settings of the sequence 20, only values being changed, or the amount of change are output. Similarly, the optimization 34 may output values for settings of the sampling pattern 27 and/or the reconstruction 23. For each iteration of the optimization, one or more values for a setting used for MRF are changed.

In one embodiment, a machine-learned network is used in optimization 34. The optimization 34 may include various settings. Different types of optimization are available. Machine learning may be used to train a network to output the type of optimization and/or settings for optimization. The "no free lunch" theorem of optimization states that there is no perfect optimization algorithm that has the ability to find optimal solutions for all possible optimization problems. To achieve the best optimization performance possible, the optimization algorithm is adapted to the specific problem (e.g., application). Machine learning is used to train a network to adapt the optimization.

Any machine learning and corresponding network architecture may be used. For example, a neural network or support vector machine is used. The input may be the application, MR scanner, ground truth 21, and/or values for sequence, sampling, and/or reconstruction settings. The machine trains the network to output to control optimization.

Figure 5:
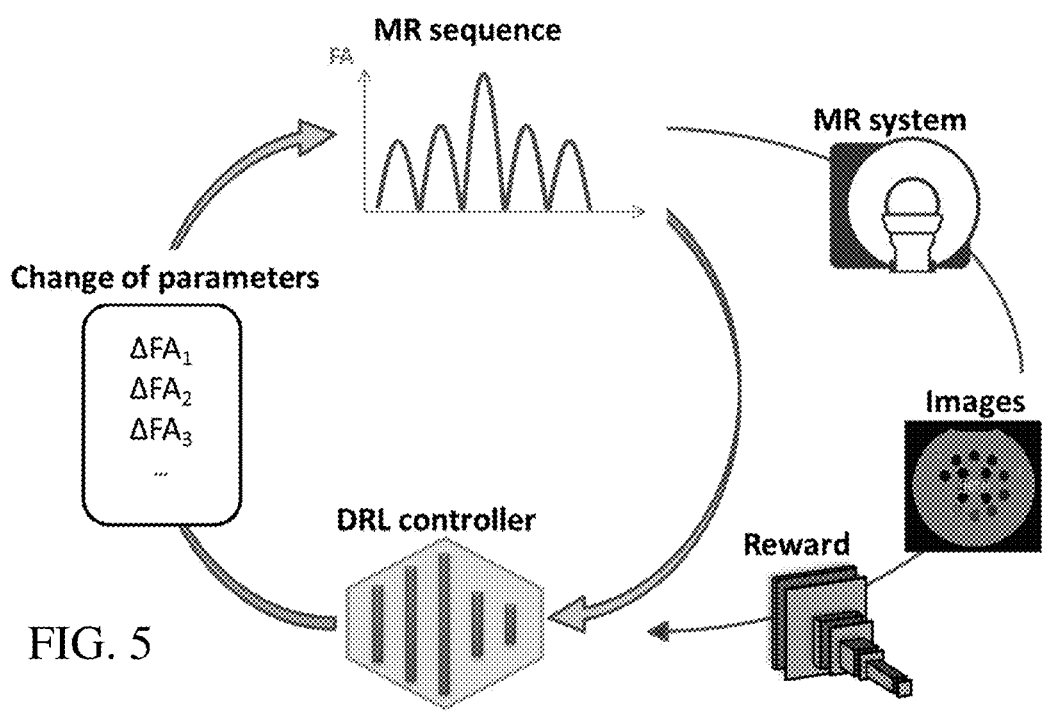
FIG. 5 illustrates use of a recurrent neural network in optimization for MRF.

In one embodiment shown in FIG. 5, a reinforcement learning neural network is used. The machine training learns a policy to determine a next action to be taken based on a reward. The action is the change in sequence, sampling, or reconstruction settings. Alternatively, the action may be the optimization algorithm or settings. The changed settings in FIG. 5 are sequence settings, resulting in a different sequence. The model of acquisition and reconstruction models the MR system or scanner and is used to generate the reconstructed parameter maps. The score is used as the reward. The controller of the machine-learned network (e.g., the policy) is used to determine the change to parameters.

The machine-learned network may be trained to output the settings to use in the optimization. The specific optimization algorithm is chosen by an engineer, and the machine-learned network (artificial intelligence (AI)) is trained to adapt the settings of this optimization algorithm to fit the objective function best. For example, for end-to-end optimization for MRF, the dynamics of the inertia weights of the particles and/or the swarm size are adapted. Depending on the problem (e.g., application, use case, MR scanner, organ, pathology, or other information), the machine-learned network outputs values for optimization settings. The machine-learned network may determine the values depending on any penalties and/or constraints, such as values of optimization settings to use for different length sequences or other features.

In another embodiment, the AI choses the most suitable optimization algorithm or combination of algorithms. Both type of optimization algorithm and settings for the algorithm may be output by the machine-learned network. The selection is based on the problem. For the end-to-end optimization, the machine-learned network may output algorithms that already proved to be useful for this problem or a similar problem, like outputting the particle swarm optimization or the interior-point algorithm. The best configuration (i.e., value for optimization settings) may be chosen for different use cases or problems.

The optimization may be dynamic. Depending of the current and past values of settings and scores, the machine-learned network may output different values of optimization settings and/or select a different type of optimization. The settings or type change over the iterations to optimize 34 the MRF. The status of the optimization may be used as input to determine whether and/or what change to the optimization to make.

The machine-learned network outputs the optimization algorithm and/or optimization setting, which are then used to optimize 34. In an alternative embodiment, the machine-learned network is trained to output the settings for the sequence 20, sampling pattern 27, and/or reconstruction 23. The machine-learned network performs the optimization instead of using an optimization algorithm. The optimization algorithm is replaced with an AI that learned to optimize. The AI controls the way the objective function (e.g., minimization or maximization of the score) is evaluated and returns the solution after a certain stopping criterion is reached. Instead of narrowing the decision down to a choice or combination of a more global or more local search and appropriate settings, this approach would give the AI control over the strategy behind the way the objective function is evaluated.

There are additional ways apart from learning to optimize in which the end-to-end optimization may benefit from machine learning. For example, a neural network is trained to approximate the objective function. The machine-learned network may be trained to perform Bloch simulation, reconstruction, sampling, or transformation. Using a machine-learned network may allow for faster function evaluations, which may allow a greater range of possible optimization algorithms due to the speed of output.

The optimization continues until a stop criterion or criteria are met. Different values are tested in the various iterations, resulting in different scores from the reconstructed maps. When a minimum or maximum of the scoring is reached, the optimization may be complete. Alternatively, a set number of iterations is used.

The values of the settings for the MR scanner configuration are selected. The optimization determines an optimal value for a sequence, sampling, or reconstruction setting. The value is optimal as providing MRF-based imaging of multiple parameters with greater accuracy, reduced acquisition time, and/or application-specific tuning.

Any number of settings may be tuned or optimized. Optimization may be optimized. Other settings have default, application based, MR scanner appropriate, or user determined values.

The optimization selects a MRF sequence from the different tested sequences, a MRF sampling pattern from the different tested sampling patterns, a MRF reconstruction setting from the different reconstruction settings, and/or an MRF optimization from the different tested optimizations. By running the optimization for a given application and type of MR scanner, MRF imaging optimized for the application and scanner is provided. The values of the settings may be used for MRF imaging by the MR scanner.

Since the optimization uses sampling and reconstruction, the generation of the sequence, transformation to k-space, application of sampling pattern, reconstruction of the fingerprints, and scoring are performed for each location in a multi-dimensional distribution of locations. The selection from the optimization is based on the scoring being for the multi-dimensional distribution of the locations. For example, the scoring may be for spatial variance. As another example, the scoring includes information from the different spatial locations.

The selected values are a configuration for the MR scanner. The selected MRF sequence, sampling pattern, and reconstruction settings for the MR scanner are provided for imaging by the MR scanner.

The modeling and optimization are performed off-line. Once selected, the settings are used by the MR scanner to scan a patient. In one example, an original configuration is based on optimizing the sequence using fingerprints for a single pixel and without including the sampling and reconstruction in the optimization model. The model with sampling and reconstruction is also used to optimize a sequence. The optimization using sampling and reconstruction results in an improvement in quality (e.g., L2 error) of 12% for the T1 and T2 maps and 11% for the PD map using Brainweb for the data. The acquisition time is 35% shorter than for the original sequence.

Figure 3:
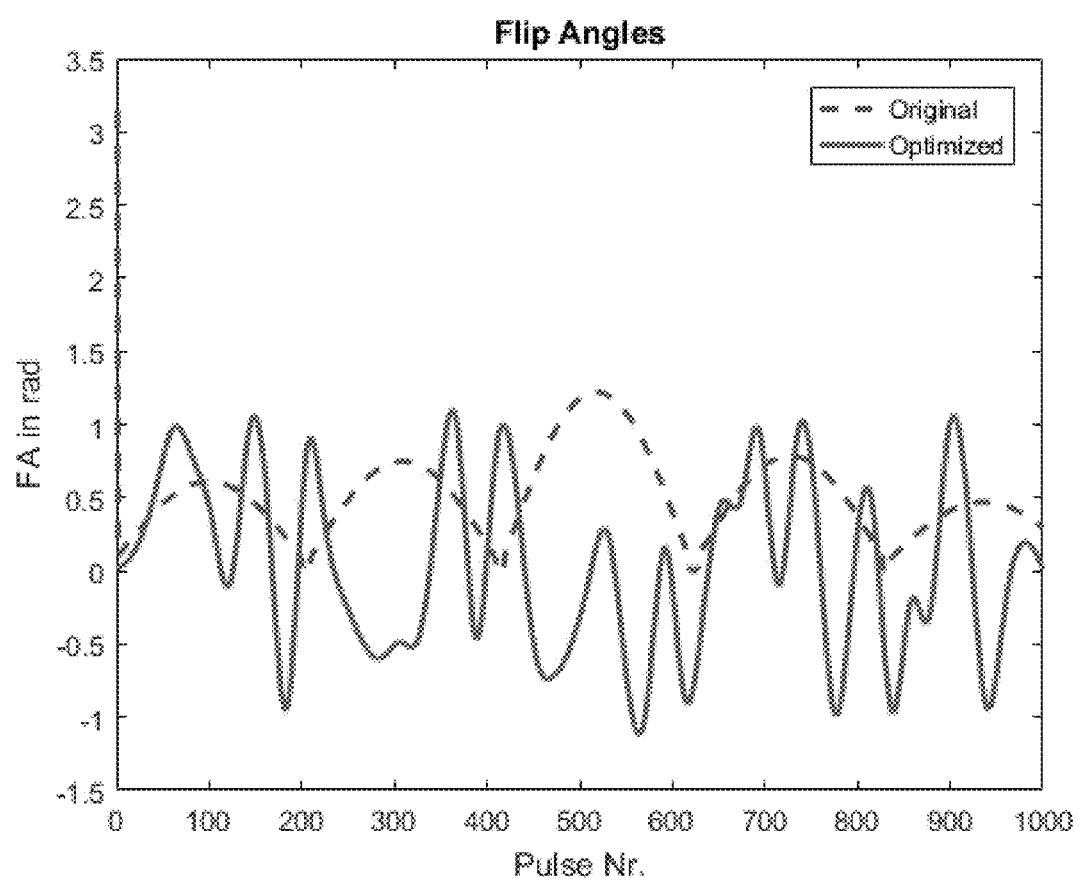
FIG. 3 illustrates an original and optimized flip angle sequence.

FIG. 3 shows an example original sequence and optimized sequence for the flip angle setting. Both sequences are for 1000 pulses. The original sequence includes an inversion pulse. The optimized sequence for the application and scanner does not have an inversion pulse In another example, the original sequence has repetition times that vary over time. The optimized sequence use repetition times that do not vary over time.

Figure 4:
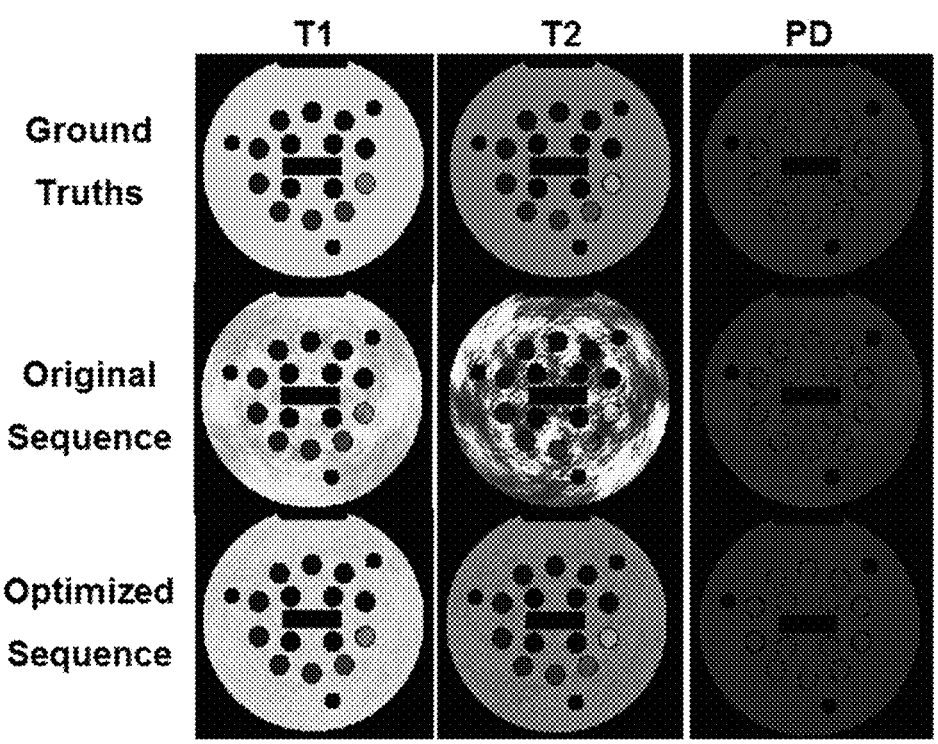
FIG. 4 illustrates planar images of a phantom for three parameters (T1, T2, and PD) generated with MRF.

FIG. 4 shows imaging a two-dimensional plane of a phantom with tubes (NIST phantom). Three parameters are imaged using MRF: T1, T2, and PD. The top layer is the ground truth. The middle layer shows MRF imaging using the original sequence. The bottom layer shows MRF imaging using the sequence optimized with the model including sampling and reconstruction. The optimized sequence has less noise for T1 and T2 and reduced outlayers of the PD map. Significant improvement is shown even where the sampling pattern, reconstruction, and optimization settings are not optimized. Optimizing for sampling, reconstruction, and/or optimization settings may further improve the MRF imaging.

The optimization takes time due to the large number of settings, modeling through entire sequences for each change or iteration, modeling for multiple locations for each iteration, modeling for different ground truth examples for each iteration, and end-to-end modeling. Since the optimization may be tuned to specific constraints and limitations and is performed for each application, pathology, type of MR scanner, or other variance, the optimization run time may be long. To increase the speed of optimization, one or more of the models or acts in the method may be replaced with a machine-learned network. For example, a machine trains to perform Block simulation. Using a neural network or other machine learning, the network is machine trained to output fingerprints based on input of the ground truth 21 and the sequence 20 with or without other information. Compression, sampling 27, reconstruction 23, matching 31, or operation may use a machine-learned network to receive the input and generate an output. Once trained, the machine-learned network allows the image processor to more quickly generate the output as compared to operating a computational model.

Machine learning may be used to create a machine-learned network that replaces the entire model including acquisition 22, reconstruction 23, scoring 33, and optimization 34. The ground truths, penalties, and constrains are selected for a given application and MR scanner and input to the machine-learned model. The machine-learned model outputs the selected settings.

Other approximations may be used to speed up the pipeline or optimization model. The dictionary size may be reduced. The amount of different tissues in the ground truths may be limited. Faster reconstruction algorithms than the ones that are used in the final application may be used, particularly where reconstruction settings are not optimized.

The MR scanner is configured with the values of the settings, including values selected from optimization. The MR scanner is configured to perform MRF imaging. A patient is scanned using the sequence with one or more settings having been optimized. The acquisition may be performed with one or more sampling settings having been optimized. The k-space data is transformed to fingerprints for each location. The reconstruction may be performed with one or more reconstruction settings having been optimized. Multiple MR parameter maps or images are generated. The images of the patient generated using MRF are improved by the optimization, so may be more diagnostically useful. The MR scanner operates better to provide the improved images due to the optimization.

Figure 6:
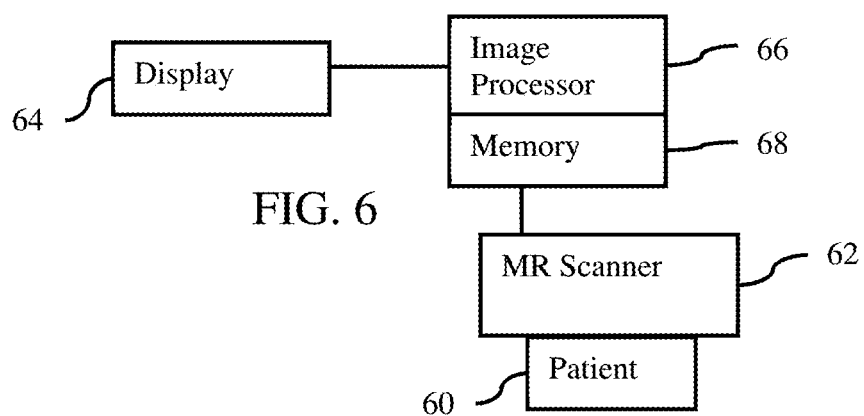
FIG. 6 is a block diagram of one embodiment of a MR system for determining a configuration for a MR scanner using MRF.

FIG. 6 is a block diagram of a medical imaging system for determining a configuration for a MR scanner using MRF. The image processor 66, using ground truth and initial values for settings stored in the memory 68, optimizes one or more of the values for a respective one or more of the settings. The optimization includes a model of the MR scanner 62 with both acquisition and reconstruction. Sampling pattern and/or reconstruction for MRF imaging are modeled to determine the optimum value or values.

The medical imaging system includes the display 64, memory 68, and image processor 66. The display 64, image processor 66, and memory 68 may be part of the MR scanner 62, a computer, server, or other system for image processing to determine a configuration of the MR scanner 62 to image the patient 60. A workstation or computer without the MR scanner 62 may be used as the medical imaging system. Additional, different, or fewer components may be provided, such as including a computer network for remote optimization. The optimization model is applied as a standalone application on a workstation or a local device or as a service deployed on network (cloud) architecture.

The MR scanner 62 is a medical diagnostic imaging system configured to scan a volume of a patient and generate anatomical information from the scan. A main magnet or coil generates a substantially uniform magnetic field through the patient 60. Gradient coils, local coils, and/or a whole-body coil generate a pulse sequence to shift spin axes of molecules in the patient away from the uniform magnetic field lines. The local coils and/or whole-body coil detect radio frequency emissions caused by the relaxation of the spin axes of the molecules returning to the magnetic field lines. This k-space data is reconstructed into an object or spatial domain using Fourier processing. After transform, the scan or image data represents tissue response from a region of the patient 60. The pulse sequence may be repeated or continues to obtain scan data representing the region over time. The pulse sequence, sampling, and reconstruction are for MRF. Parameter maps or images for multiple MR parameters are generated from the same scan using fingerprinting. The transformation generates fingerprints for each location. The reconstruction uses fingerprint matching with a dictionary to determine the values of the output MR parameters.

The image processor 66 is a control processor, general processor, digital signal processor, three-dimensional data processor, graphics processing unit, application specific integrated circuit, field programmable gate array, artificial intelligence processor, digital circuit, analog circuit, combinations thereof, or other now known or later developed device for determining values for settings in MRF. The image processor 66 is a single device, a plurality of devices, or a network. For more than one device, parallel or sequential division of processing may be used. Different devices making up the image processor 66 may perform different functions. In one embodiment, the image processor 66 is a control processor or other processor of a medical diagnostic imaging system, such as the MR scanner 62. The image processor 66 operates pursuant to stored instructions, hardware, and/or firmware to perform various acts described herein, such as optimizing, selecting, and providing a configuration to the MR scanner 62.

The image processor 66 is configured to model acquisition and reconstruction. For optimizing the pulse sequence, the scoring is based on reconstructed parameter maps (e.g., images). The sampling performed during acquisition may be modeled to provide the data for the reconstruction. The sampling and/or reconstruction may be optimized. The optimization may be optimized. The image processor 66 repetitively reconstructs parameter maps using different values for settings to find the values that lead to the MRF producing the parameter maps that most closely match the ground truth with none, one, or more penalties and/or constraints. Other scoring criteria may be used.

The optimization is for the MR scanner 62 (e.g., for the type of MR scanner) and application. The model implemented by the image processor 66 represents the MR scanner 66. The ground truths are selected for the application, such as organ and/or pathology specific application.

The image processor 66 may be configured to apply one or more machine-learned networks. A recurrent neural network may be used to optimize and/or to select settings and/or optimization type. Other neural networks or other types of machine-learned networks may be used. Any part of the model of acquisition and/or reconstruction may use a machine-learned network applied by the image processor 66.

The image processor 66 is configured to output images showing spatial distribution. Using MRF, the image processor 66 generates two or more parameter maps for each iteration of the optimization. Using modeled acquisition as well as modeled reconstruction, parameters maps are generated.

The display 64 is a CRT, LCD, projector, plasma, printer, tablet, smart phone or other now known or later developed display device. The display 64 displays the MR parameter maps as images, optimization information (e.g., values for settings), and/or configuration information.

Alternatively or additionally, the display 64 displays images generated by the MR scanner 62. Using the MRF configuration (e.g., one or more optimized values), the MR scanner 62 generates images of multiple MR parameters for the patient 60. The display 64 displays the images from the scan of the patient 60. The display 64 displays medical images for diagnosis, prognosis, and/or treatment. Due to the optimized value, the time to scan by the MR scanner is decreased, and/or the quality of the images of the patient 60 are increased.

The instructions, ground truths, values of settings, machine-learned network, outputs, configuration, and/or other information are stored in a non-transitory computer readable memory, such as the memory 68. The memory 68 is an external storage device, RAM, ROM, database, and/or a local memory (e.g., solid state drive or hard drive). The same or different non-transitory computer readable media may be used for the instructions and other data. The memory 68 may be implemented using a database management system (DBMS) and residing on a memory, such as a hard disk, RAM, or removable media. Alternatively, the memory 68 is internal to the processor 66 (e.g. cache).

The instructions for implementing the processes, methods, and/or techniques discussed herein are provided on non-transitory computer-readable storage media or memories, such as a cache, buffer, RAM, removable media, hard drive or other computer readable storage media (e.g., the memory 68). Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination.

In one embodiment, the instructions are stored on a removable media device for reading by local or remote systems. In other embodiments, the instructions are stored in a remote location for transfer through a computer network. In yet other embodiments, the instructions are stored within a given computer, CPU, GPU or system. Because some of the constituent system components and method steps depicted in the accompanying figures may be implemented in software, the actual connections between the system components (or the process steps) may differ depending upon the manner in which the present embodiments are programmed.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for determining a configuration for a magnetic resonance scanner using magnetic resonance fingerprinting, the method comprising:

generating a first image fingerprint from magnetic resonance corresponding to a first sequence and a plurality of ground truth values of magnetic resonance output parameters;

transforming the first image fingerprint to k-space;

applying a first sampling pattern to the transformed first image fingerprint;

reconstructing first values of the magnetic resonance output parameters from results of the applying of the first sampling pattern, the reconstructing using a first reconstruction setting;

scoring the first values with respect to the ground truth values;

optimizing the scoring based on repetition of the generating with different sequences than the first sequence, transforming, applying with different sampling patterns than the first sampling pattern, and reconstructing with different reconstructing settings;

selecting a magnetic resonance fingerprinting sequence from the first and different sequences, a magnetic resonance fingerprinting sampling pattern from the first and different sampling patterns, and a magnetic resonance fingerprinting reconstruction setting from the first and different reconstruction settings; and providing the selected magnetic resonance fingerprinting sequence, sampling pattern, and reconstruction setting for the magnetic resonance scanner.

2. The method of claim 1 wherein generating, transforming, applying, reconstructing, and scoring are performed for each location in a multi-dimensional distribution of locations such that the selecting is based on the scoring being for the multi-dimensional distribution of the locations.

3. The method of claim 1 wherein generating comprises generating with Block simulation.

4. The method of claim 1 wherein generating comprises generating with a phantom, the ground truth values being from a scan of the phantom.

5. The method of claim 1 wherein the repetition optimizes for the magnetic resonance fingerprinting sequence, the magnetic resonance sampling pattern, and the magnetic resonance reconstruction setting in sequence.

6. The method of claim 1 wherein scoring comprises scoring with a penalty for one of the first and different sequences, the first and different sampling patterns, or the first and different reconstruction settings.

7. The method of claim 1 wherein the repetition is limited by one or more constraints.

8. The method of claim 1 wherein the first and different sampling patterns are different trajectories, different amounts of undersampling, and/or different sampling orders.

9. The method of claim 1 wherein the first and different reconstruction settings comprise different types of reconstruction and/or different values of reconstruction parameters.

10. The method of claim 1 wherein reconstructing comprises inverse transforming the results and reconstructing by dictionary matching from the inverse transforming.

11. The method of claim 1 wherein scoring comprises scoring as a function of variance by location.

12. The method of claim 1 further comprising inverse transforming the results, applying a transform operator, and removing information in a transform operator domain, and wherein reconstructing comprises determining the first values from an output of removing the information in the transform operator domain.

13. The method of claim 1 wherein optimizing comprises optimizing with a particle swarm optimization.

14. The method of claim 1 wherein optimizing comprises optimizing with an optimization algorithm and/or optimization setting selected by a machine-learned network.

15. The method of claim 1 wherein optimizing comprises optimizing with a machine-learned network.

16. A method for determining a configuration for a magnetic resonance scanner using magnetic resonance fingerprinting, the method comprising:

optimizing the magnetic resonance fingerprinting with a model including (a) a scan sequence and/or a sampling pattern and (b) a reconstruction from fingerprint matching to a dictionary, a score for the optimizing being based on a reconstruction map of a plurality of locations, the optimizing being of (a) the scan sequence and/or a sampling pattern and (b) the reconstruction;

providing a configuration as (a) the scan sequence and/or the sampling pattern and (b) the reconstruction as optimized to the magnetic resonance scanner.

17. The method of claim 16 wherein optimizing comprises optimizing the scan sequence and the reconstruction, and wherein providing comprises providing the configuration as the scan sequence as optimized and the reconstruction as optimized.

18. The method of claim 16 wherein optimizing comprises optimizing the sampling pattern, and wherein providing the configuration comprises providing the sampling pattern as optimized.

19. The method of claim 16 wherein optimizing comprises optimizing based on an output of a machine-learned network for optimization.

20. The method of claim 16 wherein the model applies a domain transformation with fingerprint matching being in a domain of the domain transformation.

* * * * *